US010319455B2

(12) United States Patent
Kim et al.

(10) Patent No.: US 10,319,455 B2
(45) Date of Patent: Jun. 11, 2019

(54) SEMICONDUCTOR DEVICE

(71) Applicant: SK hynix Inc., Icheon (KR)

(72) Inventors: Yong Mi Kim, Hwaseong (KR); Jae Il Kim, Yongin (KR)

(73) Assignee: SK HYNIX INC., Icheon (KR)

(*) Notice: Subject to any disclaimer, the term of this patent is extended or adjusted under 35 U.S.C. 154(b) by 150 days.

(21) Appl. No.: 15/641,098

(22) Filed: Jul. 3, 2017

(65) Prior Publication Data

US 2018/0189134 A1 Jul. 5, 2018

(30) Foreign Application Priority Data

Jan. 4, 2017 (KR) ........................ 10-2017-0001432

(51) Int. Cl.
G11C 29/12 (2006.01)
G06F 11/10 (2006.01)
G11C 7/22 (2006.01)
G06F 1/12 (2006.01)
G11C 29/52 (2006.01)
G11C 7/10 (2006.01)
G11C 11/4076 (2006.01)

(52) U.S. Cl.
CPC ............ G11C 29/1201 (2013.01); G06F 1/12 (2013.01); G06F 11/1048 (2013.01); G11C 7/22 (2013.01); G11C 7/1009 (2013.01); G11C 11/4076 (2013.01); G11C 29/52 (2013.01); G11C 2207/229 (2013.01); G11C 2207/2272 (2013.01); G11C 2207/2281 (2013.01)

(58) Field of Classification Search
CPC ................ G11C 11/4076; G11C 29/52; G11C 29/12015; G11C 7/1009; G11C 7/1045; G11C 29/1201
See application file for complete search history.

(56) References Cited

U.S. PATENT DOCUMENTS

| 6,687,811 B1* | 2/2004 | Yamada ............... G06F 11/364 712/227 |
| 2007/0115750 A1* | 5/2007 | Lee ........................ G11C 8/10 365/230.06 |
| 2008/0080267 A1* | 4/2008 | Lee ..................... G11C 7/1051 365/191 |
| 2009/0059710 A1* | 3/2009 | Ko ......................... G11C 8/12 365/230.03 |
| 2014/0317470 A1* | 10/2014 | Chung ................ G06F 11/1076 714/764 |

FOREIGN PATENT DOCUMENTS

KR  10-2014-0126225 A  10/2014

* cited by examiner

Primary Examiner — Steve N Nguyen

(57) ABSTRACT

A semiconductor device includes a delay selection signal generation circuit, an internal read signal generation circuit, and an internal write signal generation circuit. The delay selection signal generation circuit generates a delay selection signal in response to an information code signal. The internal read signal generation circuit generates an internal read signal from a mask write signal in response to the delay selection signal and a clock. The internal write signal generation circuit delays the mask write signal by a predetermined delay period to generate an internal write signal.

20 Claims, 11 Drawing Sheets

FIG.3

| MRC<2> | MRC<1> | DSEL<3> | DSEL<2> | DSEL<1> |
|---|---|---|---|---|
| L | H | L | L | H |
| H | L | L | H | L |
| H | H | H | L | L |

# SEMICONDUCTOR DEVICE

CROSS-REFERENCE TO RELATED APPLICATION

The present application claims priority under 35 U.S.C. § 119(a) to Korean patent application number 10-2017-0001432, filed on Jan. 4, 2017, in the Korean Intellectual Property Office, which is incorporated herein by reference in its entirety.

BACKGROUND

1. Technical Field

Embodiments of the present disclosure relate to a semiconductor device performing an error correction operation.

2. Related Art

Recently, a Double Data Rate 2 (DDR2) scheme or a DDR3 scheme receiving and outputting four-bit data or eight-bit data during each clock cycle time has been used to increase an operating speed of a semiconductor device. When a data transmission speed of the semiconductor device increases, the probability of an occurrence of errors in data transmission may increase. Accordingly, a number of design schemes have been proposed to improve the reliability of data transmission of a semiconductor device.

When data is transmitted in a semiconductor device, error codes relating to errors may be generated and transmitted with the data to improve the reliability of data transmission. For example, error correction circuits have been used to improve the reliability of data transmission. The error codes include an error detection code (EDC) for detecting errors and an error correction code (ECC) for correcting the detected errors.

SUMMARY

Various embodiments are directed to a semiconductor device performing a data scrub operation for correcting errors occurring in data transmission.

In an embodiment, a semiconductor device includes a delay selection signal generation circuit, an internal read signal generation circuit and an internal write signal generation circuit. The delay selection signal generation circuit generates a delay selection signal in response to an information code signal. The internal read signal generation circuit generates an internal read signal from a mask write signal in response to the delay selection signal and a clock. The internal write signal generation circuit delays the mask write signal by a predetermined delay period to generate an internal write signal.

In an embodiment, a semiconductor device includes an internal read signal generation circuit, an internal write signal generation circuit and a data storage circuit. The internal read signal generation circuit delays a mask write signal by a first delay period in response to a delay select signal generated according to an information code signal to generate an internal read signal. The internal write signal generation circuit delays the mask write signal by a second delay period to generate an internal write signal. The data storage circuit outputs data stored in a memory cell array in response to the internal read signal as read data, and stores a correction data in the memory cell array in response to the internal write signal.

BRIEF DESCRIPTION OF THE DRAWINGS

FIG. 3 is a table illustrating an operation of a delay selection signal generation circuit included in the semiconductor device of FIG. 1, according to an embodiment.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

Figure 1:
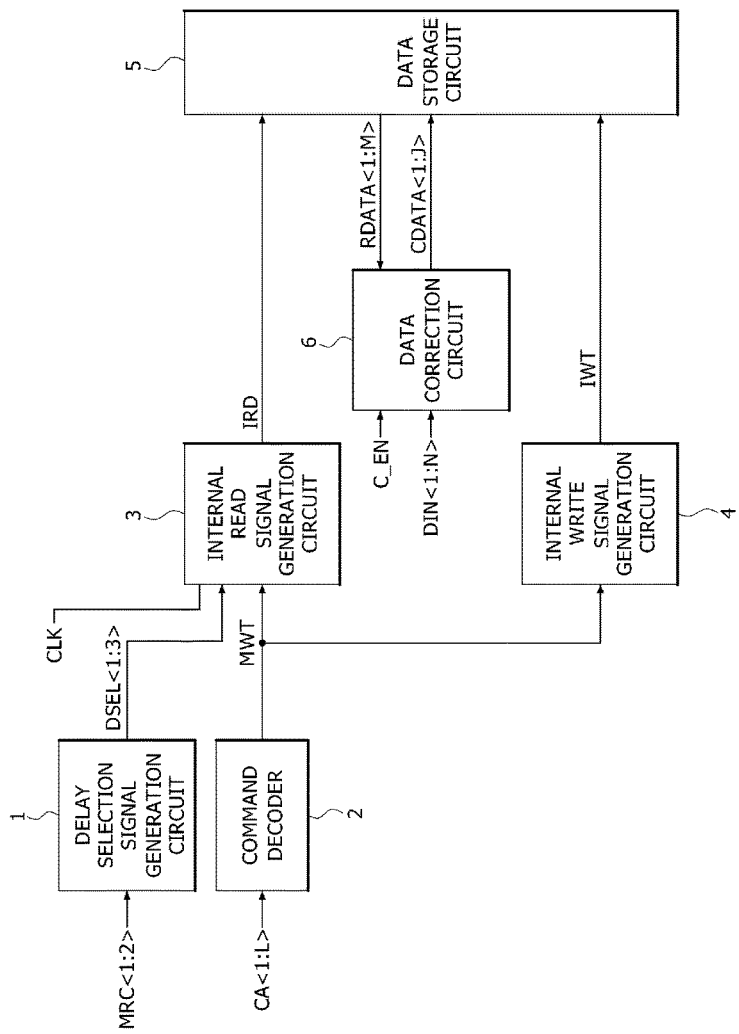
FIG. 1 is a block diagram illustrating a semiconductor device according to an embodiment.

FIG. 1 is a block diagram illustrating a semiconductor device according to an embodiment. The semiconductor device may include a delay selection signal generation circuit 1, a command decoder 2, an internal read signal generation circuit 3, an internal write signal generation circuit 4, a data storage circuit 5, and a data correction circuit 6.

The delay selection signal generation circuit 1 may generate first to third delay selection signals DSEL<1:3> in response to information code signals MRC<1:2>. The delay selection signal generation circuit 1 may generate the first to third delay selection signals DSEL<1:3>, which are selectively enabled according to a combination of logic values of the information code signals MRC<1:2>. For example, a table shown in FIG. 3 shows the first to third delay selection signals DSEL<1:3>, which are selectively enabled according to the combination of the logic values of the information code signals MRC<1:2>. The information code signals MRC<1:2> may be stored internally through a mode register set (MRS) operation or be input through external control signals CA<1:L>, L being a positive integer. Values of the information code signals MRC<1:2> may indicate an operating speed of the semiconductor device, the operating speed corresponding to a frequency of a clock signal CLK. In an embodiment, the semiconductor device operates at a first speed when the values of the information code signals MRC<1:2> are [1 0], and the semiconductor device operates at a second speed higher than the first speed when the values of the information code signals MRC<1:2> are [1 1].

The command decoder 2 may generate a mask write signal MWT in response to the external control signals CA<1:L>. The external control signals CA<1:L> may include at least one of a command and an address. The command decoder 2 may decode the command included in the external control signals CA<1:L> and generate the mask write signal MWT. The mask write signal MWT may be enabled for a mask write operation in which some bits included in data are written in a masked state. A number L of the bits of the external control signals CA<1:L> may vary according to embodiments.

The internal read signal generation circuit 3 may generate an internal read signal IRD based on the mask write signal MWT, a clock signal CLK, and the first to third delay selection signals DSEL<1:3>. The internal read signal generation circuit 3 may delay the mask write signal MWT by a first delay period in synchronization with the clock signal CLK to thereby generate the internal read signal IRD. The first delay period is determined according to a combination of logic values of the first to third delay selection signals DSEL<1:3>. The internal read signal IRD may be enabled at a time that is determined by adding the first delay period to a time at which the mask write signal MWT had most recently been enabled. A configuration and an operation of the internal read signal generation circuit 3 will be described later in more detail with reference to FIGS. 4 to 7.

The internal write signal generation circuit 4 may generate an internal write signal IWT based on the mask write signal MWT. The internal write signal generation circuit 4 may generate the internal write signal IWT which is enabled at a time that is determined by adding a second delay period to a time at which the mask write signal MWT had most recently been enabled. The second delay period may be set such that the internal write signal IWT is enabled after correction data CDATA<1:J> is generated by correcting an error of read data RDATA<1:M> outputted according to a read operation in which the internal read signal IRD is enabled. J and M are positive integers.

The data storage circuit 5 may output the read data RDATA<1:M> in response to the internal read signal IRD, and may receive and store the correction data CDATA<1:J> in response to the internal write signal IWT. The data storage circuit 5 may output the read data RDATA<1:M> stored therein when the internal read signal IRD is enabled. The data storage circuit 5 may receive and store the correction data CDATA<1:J> when the internal write signal IWT is enabled. A number M of bits of the read data RDATA<1:M> and a number J of bits of the correction data CDATA<1:J> may vary according to embodiments.

The data correction circuit 6 may generate the correction data CDATA<1:J> based on input data DIN<1:N> and the read data RDATA<1:M>, in response to a correction activation signal C_EN. The data correction circuit 6 may replace some bits masked in input data DIN<1:N> with the read data RDATA<1:M> when the correction activation signal C_EN is enabled. The data correction circuit 6 may correct one or more errors included in the input data DIN<1:N> by replacing the masked bits of the input data DIN<1:N> with the read data RDATA<1:M>, to thereby generate the correction data CDATA<1:J>. The data correction circuit 6 may generate the correction data CDATA<1:J> using an error correction code (ECC). The data correction circuit 6 may generate the correction data CDATA<1:J> using parity and syndrome generated from the read data RDATA<1:M> and the input data DIN<1:N>. For example, the parity and syndrome may be generated by replacing some bits of the input data DIN<1:N> with the read data RDATA<1:M> using the error correction code. The number N of bits of the input data DIN<1:N> may vary according to embodiments.

Figure 2:
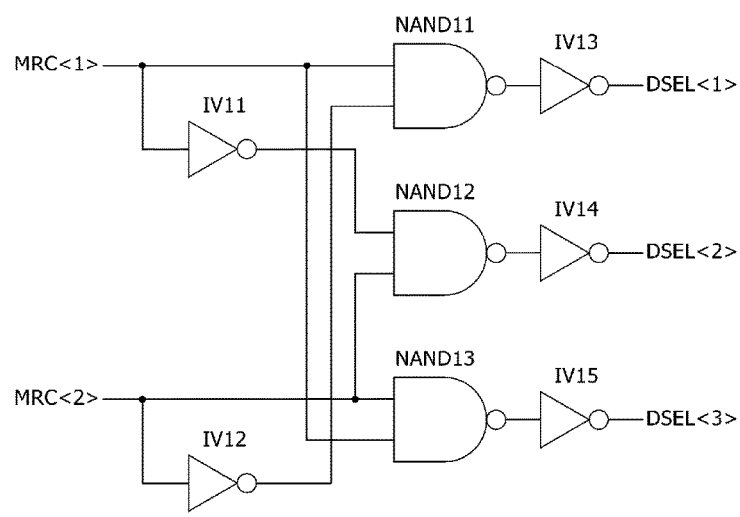
FIG. 2 is a circuit diagram illustrating a delay selection signal generation circuit included in the semiconductor device of FIG. 1, according to an embodiment.

FIG. 2 is a circuit diagram illustrating a delay selection signal generation circuit 1 included in the semiconductor device of FIG. 1, according to an embodiment. Referring to FIG. 2, the delay selection signal generation circuit 1 may include first, second, and third NAND gates NAND11, NAND12, and NAND13 and first, second, third, fourth, and fifth inverters IV11, IV12, IV13, IV14, and IV15.

The delay selection signal generation circuit 1 may generate a first delay selection signal DSEL <1> having a logic high value using the first NAND gate NAND11 and the third inverter IV13 when a first information code signal MRC <1> has the logic high value and a second information code signal MRC <2> has a logic low value. The delay selection signal generation circuit 1 may generate a second delay selection signal DSEL<2> having a logic high value using the second NAND gate NAND12 and the fourth inverter IV14 when the first information code signal MRC <1> has the logic low value and the second information code signal MRC <2> has the logic high value. The delay selection signal generation circuit 1 may generate a third delay selection signal DSEL <3> having a logic high value using the third NAND gate NAND13 and the fifth inverter IV15 when the first information code signal MRC <1> has the logic high value and the second information code signal MRC <2> has the logic high value.

FIG. 3 shows a table including logic values of the first to third delay selection signals DSEL<1:3>, which are selectively enabled according to a combination of logic values of the information code signals MRC<1:2>. In the table shown in FIG. 3, the characters "L" and "H" respectively indicate a logic low value and a logic high value.

When logic values of the second information code signal MRC<2> and the first information code signal MRC<1> correspond to "L" and "H," respectively, the first delay selection signal DSEL<1> is enabled to have the logic high value. When the logic values of the second information code signal MRC<2> and the first information code signal MRC<1> correspond to "H" and "L," respectively, the second delay selection signal DSEL<2> is enabled to have the logic high value. When the logic values of the second information code signal MRC<2> and the first information code signal MRC<1> correspond to "H" and "H," respectively, the third delay selection signal DSEL<3> is enabled to have the logic high value.

Figure 4:
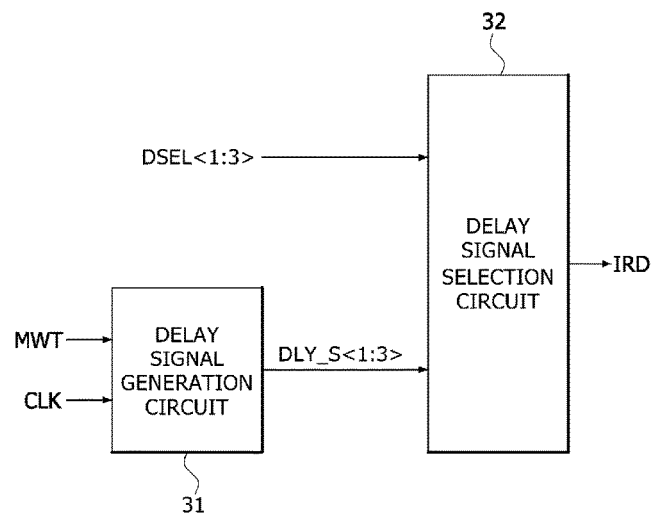
FIG. 4 is a block diagram illustrating an internal read signal generation circuit included in the semiconductor device of FIG. 1, according to an embodiment.

FIG. 4 is a block diagram illustrating an internal read signal generation circuit 3 included in the semiconductor device of FIG. 1, according to an embodiment. Referring to FIG. 4, the internal read signal generation circuit 3 may include a delay signal generation circuit 31 and a delay signal selection circuit 32.

The delay signal generation circuit 31 may generate first to third delay signals DLY_S<1:3> from a mask write signal MWT in response to a clock signal CLK. The delay signal generation circuit may sequentially delay the mask write signal MWT in synchronization with the clock signal CLK to thereby generate the first to third delay signals DLY_S<1:3>. In an embodiment, the second delay signal DLY_S<2> has a greater delay period than the first delay signal DLY_S<1>, and the third delay signal DLY_S<3> has a greater delay period than the second delay signal DLY_S<2>.

The delay signal selection circuit 32 may generate an internal read signal IRD from the first to third delay signals DLY_S<1:3> in response to the first to third delay selection signals DSEL<1:3>. The delay signal selection circuit 32 may output the first delay signal DLY_S<1> as the internal read signal IRD when the first delay selection signal DSEL<1> has a logic high value. The delay signal selection circuit 32 may output the second delay signal DLY_S<2> as the internal read signal IRD when the second delay selection signal DSEL<2> has the logic high value. The delay signal selection circuit 32 may output the third delay signal DLY_S<3> as the internal read signal IRD when the third delay selection signal DSEL<3> has the logic high value.

Figure 5:
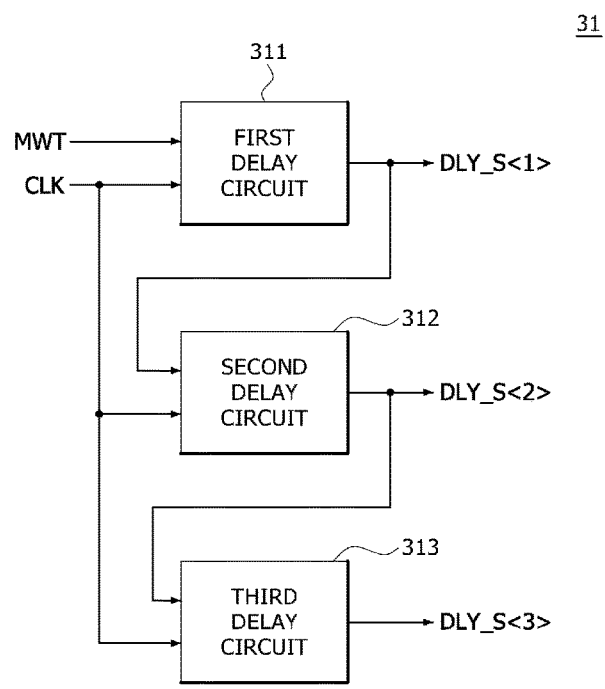
FIG. 5 is a block diagram illustrating a delay signal generation circuit included in the internal read signal generation circuit of FIG. 4, according to an embodiment.

FIG. 5 is a block diagram illustrating a delay signal generation circuit 31 included in the internal read signal generation circuit 3 of FIG. 4, according to an embodiment. Referring to FIG. 5, the delay signal generation circuit 31 may include a first delay circuit 311, a second delay circuit 312, and a third delay circuit 313. The first delay circuit 311 may delay a mask write signal MWT by a first predetermined delay period in synchronization with a clock signal CLK to thereby output a delayed version of the mask write signal MWT as the first delay signal DLY_S<1>. The second delay circuit 312 may delay the first delay signal DLY_S<1> by a second predetermined delay period in synchronization with the clock signal CLK to thereby output a delayed version of the first delay signal DLY_S<1> as the delayed second delay signal DLY_S<2>. The third delay circuit 313 may delay the second delay signal DLY_S<2> by a third predetermined delay period in synchronization with the clock signal CLK to thereby output a delayed version of the second delay signal DLY_S<2> as the third delay signal DLY_S<3>. In an embodiment, the first delay circuit 311, the second delay circuit 312, and the third delay circuit 313 may be implemented as shift registers. In an embodiment, the first, second, and third predetermined delay periods are substantially equal to each other.

Figure 6:
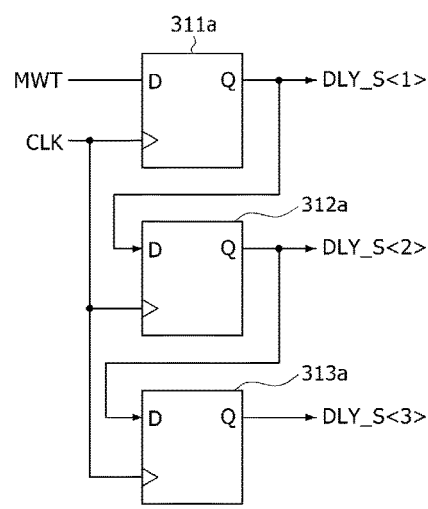
FIG. 6 is a circuit diagram illustrating the delay signal generation circuit of FIG. 5, according to an embodiment.

Referring to FIG. 6, a delay signal generation circuit 31a suitable for use as the delay signal generation circuit 31 of FIG. 5 may include a first D flip-flop 311a, a second D flip-flop 312a, and a third D flip-flop 313a. The first D flip-flop 311a may delay a mask write signal MWT in synchronization with a clock signal CLK to thereby output a delayed version of the mask write signal MWT as the first delay signal DLY_S<1>. The second D flip-flop 312a may delay the first delay signal DLY_S<1> in synchronization with the clock signal CLK to thereby output a delayed version of the first delay signal DLY_S<1> as the second delay signal DLY_S<2>. The third D flip-flop 313a may delay the second delay signal DLY_S<2> in synchronization with the clock signal CLK to thereby output a delayed version of the second delay signal DLY_S<2> as the third delay signal DLY_S<3>.

Figure 7:
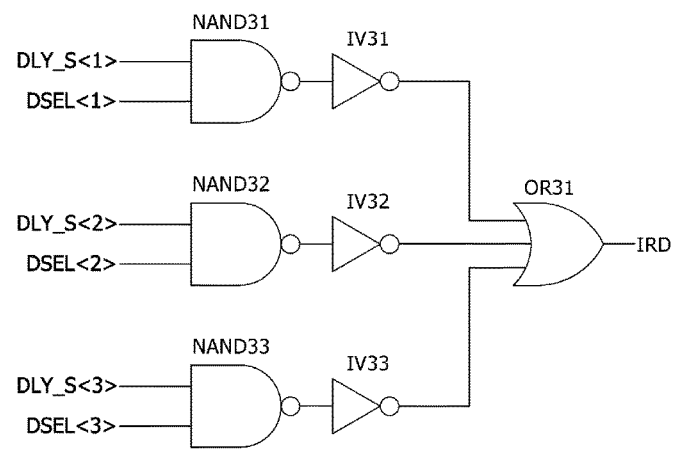
FIG. 7 is a block diagram illustrating a delay signal selection circuit included in the internal read signal generation circuit of FIG. 4, according to an embodiment.

FIG. 7 is a block diagram illustrating a delay signal selection circuit 32 included in the internal read signal generation circuit 3 of FIG. 4, according to an embodiment. Referring to FIG. 7, the delay signal selection circuit 32 may include first, second, and third NAND gates NAND31, NAND32, and NAND33, first, second, and third inverters IV31, IV32, and IV33, and an OR gate OR31. The delay signal selection circuit 32 may output the first delay signal DLY_S<1> through the first NAND gate NAND31, the first inverter IV31, and the OR gate OR31 as the internal read signal IRD when the first delay selection signal DSEL<1> has a logic high value. The delay signal selection circuit 32 may output a second delay signal DLY_S<2> (e.g., the second delay signal DLY_S<2> of FIG. 4) through the second NAND gate NAND32, the second inverter IV32, and the OR gate OR31 as the internal read signal IRD when the second delay selection signal DSEL<2> has the logic high value. The delay signal selection circuit 32 may output the third delay signal DLY_S<3> through the third NAND gate NAND33, the third inverter IV33, and the OR gate OR31 as the internal read signal IRD when the third delay selection signal DSEL<3> has the logic high value.

Figure 8:
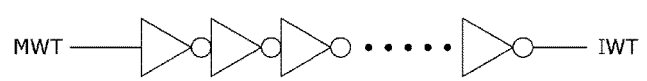
FIG. 8 is a circuit diagram illustrating an internal write signal generation circuit included in the semiconductor device of FIG. 1, according to an embodiment.

FIG. 8 is a circuit diagram illustrating an internal write signal generation circuit 4 included in the semiconductor device of FIG. 1, according to an embodiment. Referring to FIG. 8, the internal write signal generation circuit 4 may include an inverter chain. The internal write signal generation circuit 4 may generate the internal write signal IWT which is enabled at a time that is determined by adding to a second delay period to a time at which the mask write signal MWT had most recently been enabled. The second delay period may be set such that the internal write signal IWT is enabled after the correction data CDATA<1:J> has been generated.

Figure 9:
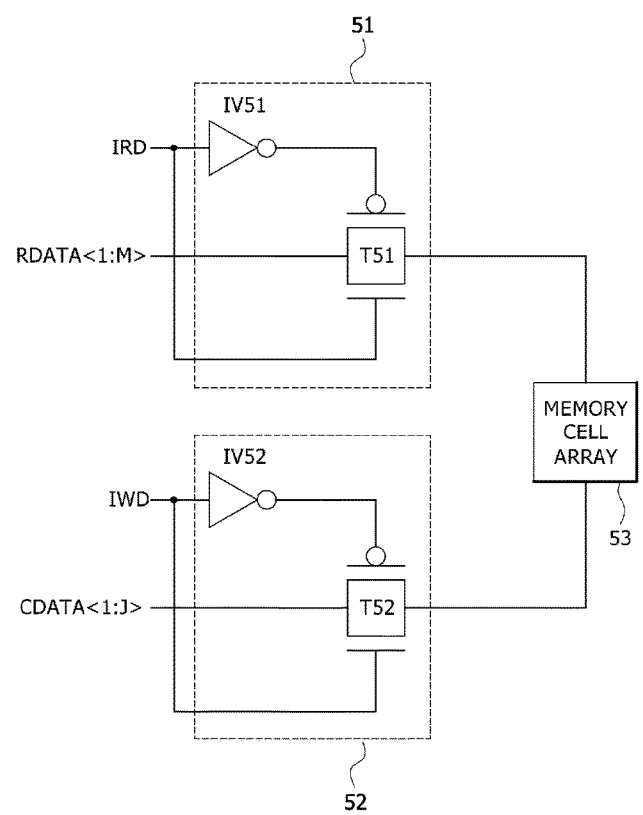
FIG. 9 is a circuit diagram illustrating a data storage circuit included in the semiconductor device of FIG. 1, according to an embodiment.

FIG. 9 is a circuit diagram illustrating a data storage circuit 5 included in the semiconductor device of FIG. 1, according to an embodiment. Referring to FIG. 9, the data storage circuit 5 may include a data output circuit 51, a data input circuit 52, and a memory cell array 53. The data output circuit 51 may include a first inverter IV51 and a first transmission gate T51. The data output circuit 51 may output data stored in the memory cell array 53 as the read data RDATA<1:M> when the internal read signal IRD has a logic high value. The data input circuit 52 may include a second inverter IV52, and a second transmission gate T52. The data input circuit 52 may store the correction data CDATA<1:J> in the memory cell array 53 when the internal write signal IWT has the logic high value. The memory cell array 53 may include a plurality of memory cells.

As described above, when a mask write operation is performed, the semiconductor device according to the present embodiment performs a data scrub operation in which error correction is performed to store the generated correction data (CDATA <1:J>) in the data storage circuit 5 after replacing the bits to be masked among the bits included in the input data DIN <1:N> by the read data RDATA <1:M>. The semiconductor device according to the present embodiment may perform a read operation for outputting the read data RDATA<1:M> at a point of time when the first delay section has elapsed from when the mask write signal MWT is enabled when the data scrub operation is performed. Since the first delay period of the semiconductor device according to the present embodiment can be freely adjusted by the information code signals MRC<1:2>, even if the operating speed varies according to the frequency of the clock CLK, so that the data scrub operation may be stably performed.

For example, when the semiconductor device operates at a first operating speed corresponding to a first frequency of the clock signal CLK, the semiconductor device selects the third delay signal DLY_S<3> as the internal read signal IRD. When the semiconductor device operates at a second operating speed corresponding to a second frequency of the clock signal CLK that is lower than the first frequency, the semiconductor device selects the second delay signal DLY_S<2> or the first delay signal DLY_S<1> as the internal read signal IRD. As a result, a time interval between a rising edge of the internal read signal IRD and a rising edge of the internal write signal IWT may remain substantially the same regardless of the operating speed of the semiconductor device, ensuring a sufficient duration of time to perform the data scrub operation.

Figure 10:
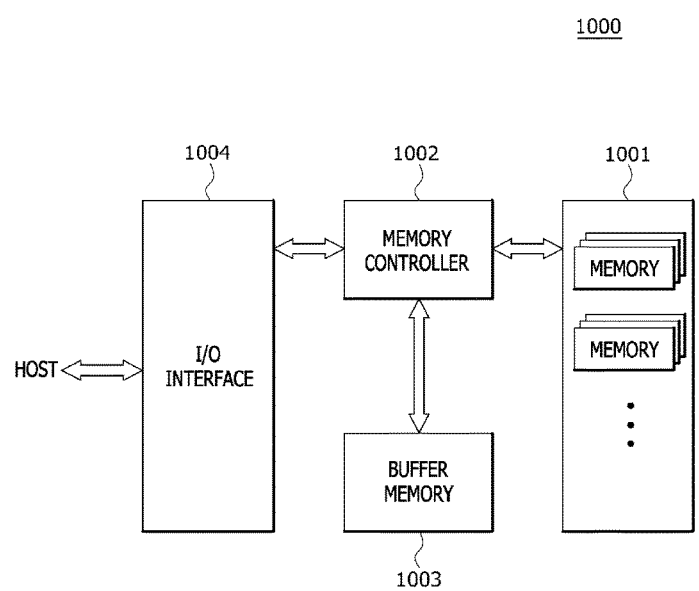
FIG. 10 is a block diagram illustrating an electronic system employing the semiconductor device shown in FIG. 1, according to an embodiment.

The semiconductor device of FIG. 1 may be part of an electronic system that includes a memory system, a graphic system, a computing system, a mobile system, or the like. For example, as illustrated in FIG. 10, an electronic system 1000 according to an embodiment may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal generated from the memory controller 1002. The data storage circuit 1001 may include the semiconductor device illustrated in FIG. 1. The data storage circuit 1001 may further include a nonvolatile memory that can retain its stored data even when its power supply is interrupted. The nonvolatile memory may be a flash memory, such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001, or the buffer memory 1003, or for outputting the data stored in the data storage circuit 1001 or the buffer memory 1003. Although FIG. 5 illustrates the memory controller 1002 with a single block, the memory controller 1002 may include one controller for controlling the data storage circuit 1001 comprised of a nonvolatile memory, and another controller for controlling the buffer memory 1003 comprised of a volatile memory.

The buffer memory 1003 may temporarily store the data which are processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

Figure 11:
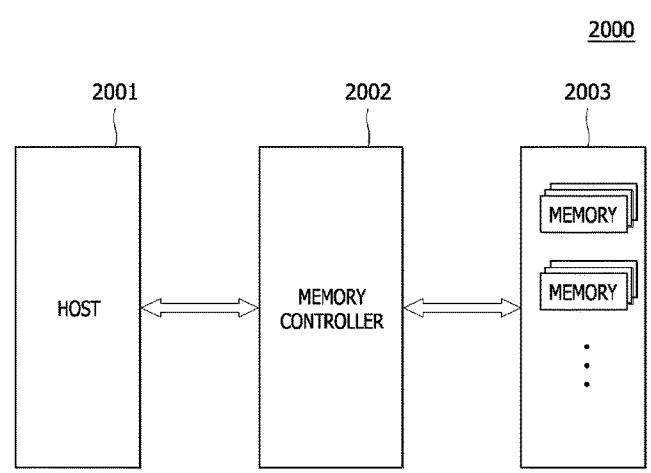
FIG. 11 is a block diagram illustrating an electronic system employing the semiconductor device shown in FIG. 1, according to another embodiment.

Referring to FIG. 11, an electronic system 2000 according another embodiment may include a host 2001, a memory controller 2002 and a data storage circuit 2003.

The host 2001 may output a request signal and data to the memory controller 2002 to access the data storage circuit 2003. The memory controller 2002 may supply the data, a data strobe signal, a command, addresses, and a clock signal to the data storage circuit 2003 in response to the request signal, and the data storage circuit 2003 may execute a write operation or a read operation in response to the command. The host 2001 may transmit the data to the memory controller 2002 to store the data into the data storage circuit 2003. In addition, the host 2001 may receive the data outputted from the data storage circuit 2003 through the memory controller 2002. The host 2001 may include a circuit that corrects errors of the data using an error correction code (ECC) scheme.

The memory controller 2002 may act as an interface that connects the host 2001 to the data storage circuit 2003 for communication between the host 2001 and the data storage circuit 2003. The memory controller 2002 may receive the request signal and the data outputted from the host 2001 and may generate and supply the data, the data strobe signal, the command, the addresses, and the clock signal to the data storage circuit 2003, in order to control operations of the data storage circuit 2003. In addition, the memory controller 2002 may supply the data outputted from the data storage circuit 2003 to the host 2001.

The data storage circuit 2003 may include a plurality of memories. The data storage circuit 2003 may receive the data, the data strobe signal, the command, the addresses, and the clock signal from the memory controller 2002 to execute the write operation or the read operation. Each of the memories included in the data storage circuit 2003 may include a circuit that corrects the errors of the data using an error correction code (ECC) scheme.

In some embodiments, the electronic system 2000 may be realized to selectively operate any one of the ECC circuits included in the host 2001 and the data storage circuit 2003. Alternatively, the electronic system 2000 may be realized to simultaneously operate all of the ECC circuits included in the host 2001 and the data storage circuit 2003. The host 2001 and the memory controller 2002 may be realized in a single chip according to the embodiments. The memory controller 2002 and the data storage circuit 2003 may be realized in a single chip according to the embodiments.

What is claimed is:

1. A semiconductor device comprising:
   a delay selection signal generation circuit configured to generate a delay selection signal in response to an information code signal;
   an internal read signal generation circuit configured to generate an internal read signal according to a mask write signal, the delay selection signal, and a clock signal; and
   an internal write signal generation circuit configured to delay the mask write signal by a predetermined delay period to generate an internal write signal.

2. The semiconductor device of claim 1, wherein the information code signal is stored internally through a mode register set operation.

3. The semiconductor device according to claim 1, wherein the internal read signal generation circuit delays the mask write signal by a delay period in synchronization with the clock signal to generate the internal read signal, the delay period being determined according to a combination of logic values of the information code signal.

4. The semiconductor device according to claim 1, wherein the delay selection signal comprises first and second delay selection signals, and
wherein the first and second delay selection signals are selectively enabled in accordance with a logic value of the information code signal.

5. The semiconductor device according to claim 4, wherein the internal read signal generation circuit includes:
a delay signal generation circuit configured to sequentially delay the mask write signal in synchronization with the clock signal to generate a first delay signal and a second delay signal.

6. The semiconductor device according to claim 5, wherein the delay signal generation circuit includes:
a first delay circuit configured to delay the mask write signal in synchronization with the clock signal to generate the first delay signal; and
a second delay circuit configured to delay the first delay signal in synchronization with the clock signal to generate the second delay signal.

7. The semiconductor device according to claim 5, wherein the internal read signal generation circuit further includes:
a delay signal selection circuit configured to generate the internal read signal from the first and second delay signals in response to the first and second delay selection signals.

8. The semiconductor device according to claim 7, wherein the delay signal selection circuit outputs the first delay signal as the internal read signal when the first delay selection signal is enabled, and outputs the second delay signal as the internal read signal when the second delay selection signal is enabled.

9. The semiconductor device according to claim 1, wherein the predetermined delay period is determined to enable the internal write signal after the correction data is generated.

10. The semiconductor device according to claim 9, wherein the data correction circuit replaces some bits of the input data with read data and generates the correction data using an error correction code.

11. The semiconductor device according to claim 1, further comprising a command decoder configured to decode an external control signal and generate the mask write signal,
wherein the mask write signal is enabled to initiate a mask write operation in which some bits of input data are written in a masked state.

12. The semiconductor device according to claim 11, wherein the external control signal includes one or both of a command and an address.

13. The semiconductor device according to claim 1, further comprising:
a data storage circuit configured to output data stored in a memory cell array in response to the internal read signal, and stores correction data in the memory cell array in response to the internal write signal.

14. A semiconductor device comprising:
an internal read signal generation circuit configured to delay a mask write signal by a first delay period in response to a delay selection signal to generate an internal read signal, the delay selection signal being generated according to an information code signal;
an internal write signal generation circuit configured to delay the mask write signal by a second delay period to generate an internal write signal; and
a data storage circuit configured to output data stored in a memory cell array in response to the internal read signal, and store correction data in the memory cell array in response to the internal write signal.

15. The semiconductor device according to claim 14, wherein the information code signal includes a plurality of information code signals, and
wherein the internal read signal generation circuit delays the mask write signal in synchronization with a clock signal according to a combination of logic values of the plurality of information code signals.

16. The semiconductor device of claim 14, wherein the information code signal is stored internally through a mode register set operation.

17. The semiconductor device according to claim 14, wherein the delay selection signal includes first and second delay selection signals, and
wherein the internal read signal generation circuit includes:
a delay signal generation circuit configured to sequentially delay the mask write signal in synchronization with a clock signal to generate a first delay signal and a second delay signal; and
a delay signal selection circuit configured to select one of the first and second delay signals as the internal read signal in response to the first and second delay selection signals.

18. The semiconductor device according to claim 14, wherein the second delay period is determined to enable the internal write signal after the correction data is generated.

19. The semiconductor device according to claim 18, wherein the data correction circuit replaces some bits of the input data with read data and generates the correction data using an error correction code, the read data being the data output from the memory cell array.

20. The semiconductor device according to claim 14, further comprising a command decoder configured to decode an external control signal and generate the mask write signal,
wherein the mask write signal is enabled to initiate a mask write operation in which some bits of input data are written in a masked state.

* * * * *